(12) United States Patent
Henry (10) Patent No.: US 10,811,401 B1
(45) Date of Patent: Oct. 20, 2020

(54) MAINTAINING ALIGNMENT BETWEEN A LED DEVICE AND A BACKPLANE DURING BONDING

(71) Applicant: Facebook Technologies, LLC, Menlo Park, CA (US)

(72) Inventor: William Padraic Henry, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 85 days.

(21) Appl. No.: 15/836,621

(22) Filed: Dec. 8, 2017

(51) Int. Cl.
| | | |
|---|---|---|
| *H01L 25/18* | (2006.01) | |
| *H01L 27/15* | (2006.01) | |
| *H01L 33/00* | (2010.01) | |

(52) U.S. Cl.
CPC .......... *H01L 25/18* (2013.01); *H01L 27/156* (2013.01); *H01L 33/007* (2013.01); *H01L 2224/0224* (2013.01); *H01L 2224/0812* (2013.01); *H01L 2225/06503* (2013.01); *H01L 2933/0016* (2013.01)

(58) Field of Classification Search
CPC ............... H01L 25/18; H01L 27/156; H01L 2224/0224; H01L 2224/8012; H01L 2224/0812

See application file for complete search history.

(56) References Cited

U.S. PATENT DOCUMENTS

| | | | | |
|---|---|---|---|---|
| 2018/0233536 | A1* | 8/2018 | Chang | ............... H01L 33/56 |
| 2019/0097103 | A1* | 3/2019 | Chu | ............... H01L 33/0095 |
| 2019/0123033 | A1* | 4/2019 | Martin | ............... H01L 33/16 |
| 2019/0157333 | A1* | 5/2019 | Tsai | ............... H01L 23/5226 |

\* cited by examiner

*Primary Examiner* — Jamie C Niesz
(74) *Attorney, Agent, or Firm* — Fenwick & West LLP (57) ABSTRACT

Embodiments described herein relate to maintaining alignment between materials having different coefficients of thermal expansion during a bonding process of a light emitting diode (LED) device. The LED device includes a LED array and a backplane. The LED array and the backplane each include a plurality of electrodes. During a bonding process where the electrodes of the LED array and electrodes of a backplane are bonded together, an alignment material having a coefficient of thermal expansion different than a coefficient of thermal expansion of the material of the LED array is deposited between LEDs of the LED array.

5 Claims, 8 Drawing Sheets

MAINTAINING ALIGNMENT BETWEEN A LED DEVICE AND A BACKPLANE DURING BONDING

BACKGROUND

The present disclosure relates to a bonding process that maintains alignment between materials having different coefficients of thermal expansion.

BACKGROUND

Bonding different semiconductor materials is referred to as heterogeneous hybridization. However, heterogeneous hybridization is difficult due to different properties of the semiconductor materials being bonded. For example, the materials being bonded together may expand at different rates based on a temperature change due to the different coefficient of thermal expansion of the materials. Thus, it is difficult to maintain alignment between contact points of materials being bonded when ambient temperature changes, resulting in faulty devices due to the contact points of the materials being misaligned during the bonding process.

SUMMARY

Embodiments described herein relate to maintaining alignment between materials having different coefficients of thermal expansion during a bonding process of a light emitting diode (LED) device. The LED device includes a LED array and a backplane. The LED array and the backplane each include a plurality of electrodes. During a bonding process where the electrodes of the LED array and electrodes of a backplane are bonded together, an alignment material having a coefficient of thermal expansion different than a coefficient of thermal expansion of the material of the LED array is deposited between individual components of the LED array. The alignment material restricts the expansion of the LED array during the bonding process, thereby maintaining alignment between the electrodes of the LED array and the electrodes of the backplane during the bonding process.

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments of the present disclosure generally relate to a μLED array including an alignment material that maintains an alignment between electrodes of the μLED array and electrodes of a backplane during a bonding process that bonds together the μLED array and the backplane.

The term "μLED" describes an LED that is smaller than a standard cuboid LED in one embodiment. A μLED may have an active region of approximately less than 80 μm diameter.

μLED Structure

Figure 1:
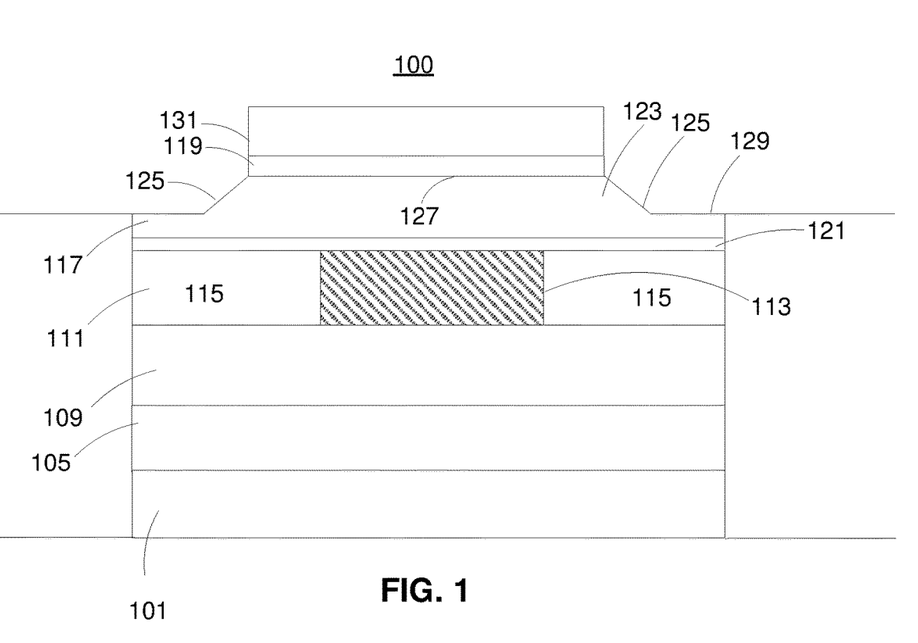
FIG. 1 is cross-section of a μLED device according to one embodiment.

FIG. 1 illustrates a cross-section of a μLED 100 of a μLED array according to one embodiment. Although only a single μLED 100 is shown, the μLED array may include a plurality of μLEDs. In other embodiments, the μLED 100 may include other layers than those discussed herein.

As shown in FIG. 1, the μLED 100 includes a substrate 101. The substrate 101 is made of sapphire in one embodiment. However, in other embodiments the substrate 101 may be made of other materials such as silicon, silicon carbide, or free standing Gallium Nitride (GaN). The substrate 101 may be removed after forming of the μLED 100. Thus, the μLED array may lack a substrate 101. The uLED array may also be weakly bonded to the substrate such that the uLED array may expanded at a different rate than the substrate.

The μLED 100 may also include a buffer layer and undoped GaN 105 on the substrate 101. A doped GaN layer 109 (e.g., n-GaN) is on the undoped GaN layer 105. A quantum well (QW) layer 111 or otherwise referred to as a quantum well region is on the n-type GaN layer 109. The QW layer 111 includes one or more quantum well structures that comprise a confined active region 113 and one or more non-active regions 115. The confined active region 113 of the μLED 100 emits light responsive to an application of an electrical current to the confined active region 113. The non-active regions 115 do not emit light as the current is channeled into the confined active region 113.

A semiconductor layer 117 is on the QW layer 111. In one embodiment, the semiconductor layer 117 is made of p-type GaN (e.g., p-GaN). The semiconductor layer may also comprise of both a p-GaN layer 117 and a capping layer 119 that is grown over the p-GaN layer 117. The capping layer 119 may be made of highly doped p++ GaN, indium tin oxide (ITO), or other transparent conductors. Furthermore, an electron blocking layer (EBL) 121 such as aluminum gallium nitride (AlGaN) could be grown between the QW layer 111 and p-GaN layer 117 to improve the performance of the confined active region 113. The semiconductor layer 117 can have a thickness in the range of 50 nm to 200 nm in one embodiment but can be other thicknesses in different embodiments.

In one embodiment, the μLED 100 includes an electrode 131 (e.g., a contact). The electrode 131 may be a reflective layer. As shown in FIG. 1, the electrode 131 may be formed on the capping layer 119. However, in embodiments without the capping layer 119, the electrode layer 131 may be formed on the semiconductor layer 117. The electrode 131 may be made of aluminum, silver, or any other metal or combination of metals with conductive properties.

Figure 2A:
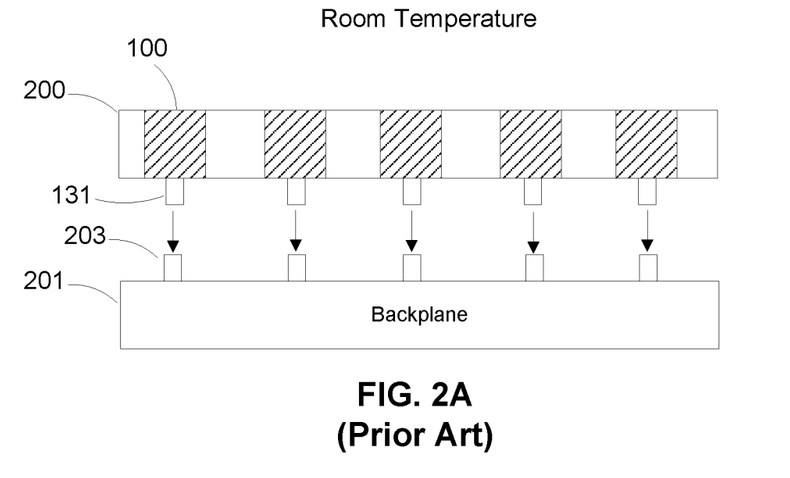
FIGS. 2A to 2C illustrate a bonding process for bonding electrodes of a μLED array to electrodes of a backplane.
Figure 2B:
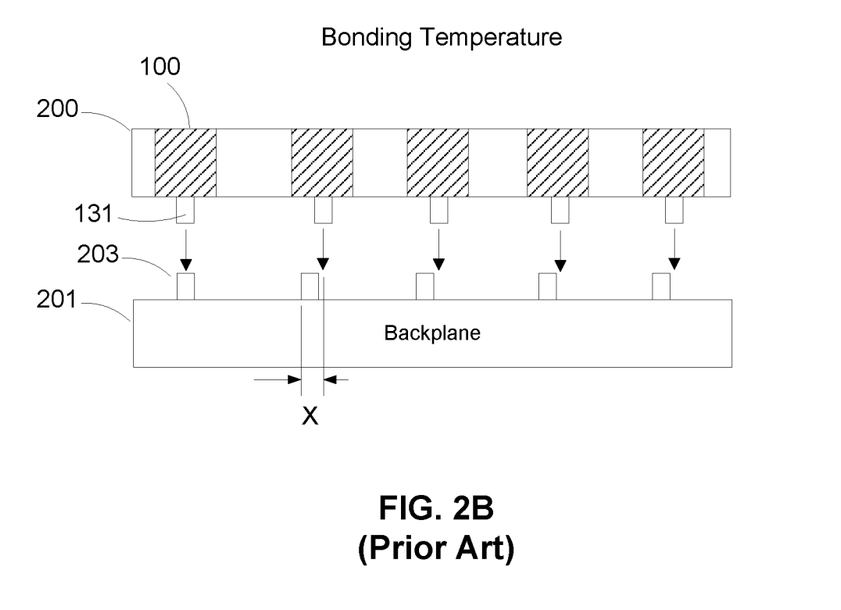
Figure 2C:
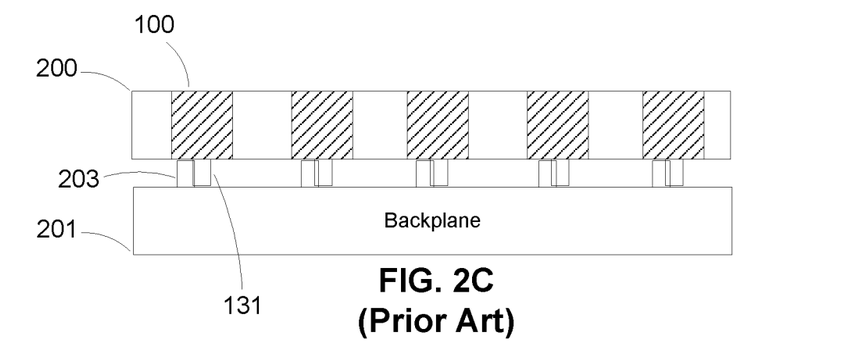

FIGS. 2A, 2B, and 2C illustrate an example process for bonding a μLED array 200 to a backplane 201. The backplane 201 may be a circuit board to which other circuit boards are connected. For example, the backplane 201 may be a substrate that comprises driver electronics for a display device. Thus, bonding the μLED array 200 to the backplane 201 electrically connects the μLED array 200 to the driver electronics of the display device.

Thermocompression bonding may be used to bond the μLED array 200 to the backplane 201. Thermocompression bonding relies up the simultaneous application of force and heat to bond together the μLED array 200 and the backplane 201. Bonding processes other than thermocompression bonding that rely upon temperature to bond two different materials together may also be used.

FIG. 2A illustrates a μLED array 200 and the backplane 201 at room temperature prior to the bonding process to bond together the μLED array 200 and the backplane 201. As shown in FIG. 2A, the μLED array 200 includes a plurality of μLEDs 100 described above in FIG. 1. Each of the μLEDs 100 includes an electrode 131. The backplane 201 also includes a plurality of electrodes 203. Each electrode 131 of the μLED array 200 is configured to be bonded to a corresponding one of the electrodes 203 of the backplane 201. As shown in FIG. 2A, at room temperature prior to starting the bonding process to bond the μLED array 200 and the backplane 201, each electrode 131 of the μLED array 200 is aligned with a corresponding electrode 203 of the backplane 201.

The μLED array 200 and the backplane 201 are made of different materials. Particularly, the μLED array 200 and the backplane 201 are made of materials that have different coefficients of thermal expansion (CTE). For example, the μLED array 200 is made of primarily of Galium Nitride and the backplane 201 is made of silicon. The electrodes 131, 203 may be made of copper and tin, having a bonding temperature of 150° C. to 280° C. Hence, the thermocompression process for bonding electrodes 131 of the μLED array 200 and electrodes 203 of the backplane 201 are typically performed at this temperature range.

Since the μLED array 200 and the backplane 201 have different CTEs, the μLED array 200 and the backplane 201 expand at different rates at the bonding temperature used during thermocompression bonding. The different rates of expansion of the μLED array 200 and the backplane 201 cause a misalignment "x" of the electrodes 131 and the electrodes 203 during thermocompression bonding. As shown in FIG. 2B, at the bonding temperature the μLED 200 and the backplane 201 expand at different rates resulting in the misalignment "x" of the electrodes 131 and the electrodes 203. As a result of the misalignment, one or more of the electrodes 131 of the μLED array 200 and one or more of the electrodes 203 of the backplane 201 may not be bonded together to form an electrical connection between μLEDs 100 and the backplane 201 as shown in FIG. 2C. In addition, as the μLED array 200 and backplane 201 are cooled after bonding, they will contract at different rates. This can lead to stress within the material and hence any bonds that have been formed may be broken.

Figure 3:
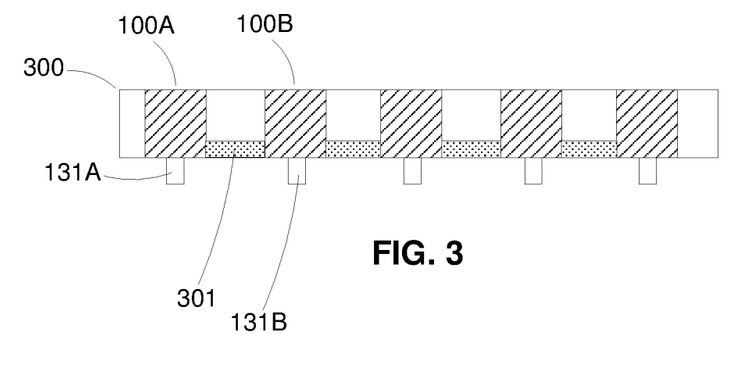
FIG. 3 is a cross-section of a μLED array including alignment material between elements of the μLED array, according to one embodiment.

FIG. 3 illustrates a μLED array 300 that includes an alignment material 301, according to one embodiment. The alignment material 301 reduces the misalignment of the electrodes 131 (e.g., electrodes 131A and 131B) of the μLED array 300 and the electrodes 203 of the backplane 201 during thermocompression bonding. In one embodiment, alignment material 301 is deposited between a pair of individual LEDs of the μLED array 300. The material may be deposited by number of process such as Chemical Vapor Deposition and sputtering. After deposition the properties of the alignment material 301 may be further optimized by post-processing steps such as baking. For example, as shown in FIG. 3 the misalignment material 301 is deposited between μLED 100A and μLED 100B. In certain embodiments, the alignment material may be the only material which is in contact with both uLEDs. As such they would not be in contact without the alignment material. The μLED array 300 may be on a carrier substrate. This carrier substrate may be its growth substrate—such as sapphire or silicon carbide—or it may be a different substrate. In one embodiment, the μLED array 300 is weakly bonded to the growth substrate such that the individual LEDs of the μLED array may move relative to each other and the substrate when the temperature is changed. As such the μLED may move to maintain alignment between the electrodes on the μLED array and the electrodes on the backplane.

Generally, the material used for the alignment material 301 is selected based on the material used for the μLED array 300 and the backplane 201. Also, the amount of material to be deposited may be selected based on the bonding process temperature and the CTE mismatch between the materials to be bonded. The material may or may not be electrically conducting. The material for the alignment material 301 is selected to have a CTE that causes the alignment material 301 to expand in a manner during thermocompression bonding that maintains alignment between the electrodes 131 of the μLED array 300 and the electrodes 203 of the backplane 201. The alignment material may include one or more of amorphous silicon, hafnia, ZERODUR (e.g., lithium-aluminosilicate glass-ceramic), tantalum dioxidefluoride or other low CTE materials. Examples of conductivity materials with low CTEs including tantalum and tungsten. It should be noted that the CTE of amorphous silicon may be changed by the level of hydrogen incorporation. Similar optimization work may be carried out on other alignment materials to produce the target CTE. Materials may also be designed to have the most optimum CTE to be used to maintain alignment. In one embodiment, the alignment material 301 made of tantalum dioxidefluoride (TaO$_2$F) that has a CTE of $0.6 \times 10^{-6}$ m/mK is selected if the μLED array 300 is made of Galium Nitride and the backplane 201 is made of silicon.

Figure 4A:
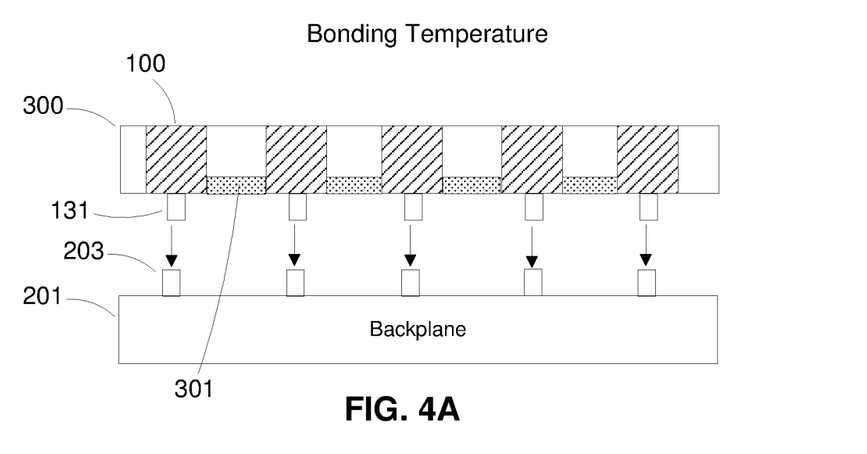
FIGS. 4A to 4B illustrate a bonding process of bonding electrodes of a μLED array including the alignment material to electrodes of a backplane, according to one embodiment.
Figure 4B:
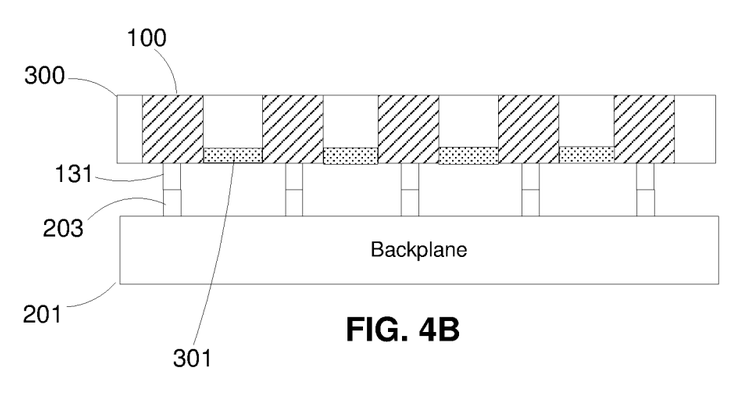

FIGS. 4A and 4B illustrate an example process for bonding a μLED array 300 having alignment material 301 to the backplane 201, according to one embodiment. In contrast to FIG. 2B, at the bonding temperature of the thermocompression bonding process, the electrodes 131 of the μLED array 300 are aligned with the electrodes 203 of the backplane 201 due to the alignment material 301 as shown in FIG. 4A during bonding temperature as well as room temperature. At the bonding temperature, the alignment material 301 has expanded to ensure that the electrodes 131 of the μLED array 300 remain aligned with the electrodes 203 of the backplane 201. As a result of the alignment, the electrodes 131 of the μLED array 300 are bonded to the electrodes 203 of the backplane during thermocompression as shown in FIG. 4B thereby ensuring electrical connection between each μLED 100 and the driver electronics included in the backplane 201. Moreover, the contact between electrodes 131, 203 are likely to be more reliable because these electrodes 131, 203 are not subject to stress at room temperature due to difference in CTEs of μLED array 300 and the backplane 201.

Method of Bonding

Figure 5:
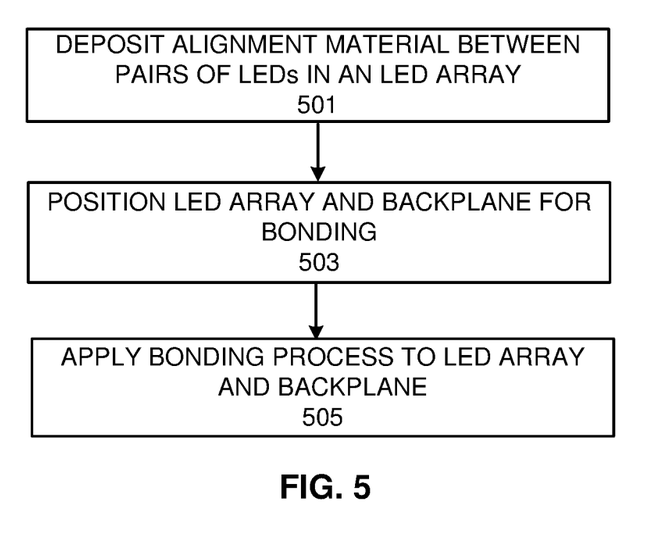
FIG. 5 is a flowchart illustrating a process for bonding a LED array and a backplane, according to one embodiment.

FIG. 5 is a flowchart illustrating a process for bonding together a μLED array and a backplane, according to one embodiment. In FIG. 5, it is assumed that the μLED array and the backplane have already been formed. In other embodiments, steps other than those shown in FIG. 5 may be performed.

In one embodiment, an alignment material is formed 501 between pairs of individual uLEDs of a μLED array. The alignment material may be formed on the μLED array at the location performing the bonding to bond together the μLED array and the backplane. The μLED array and the backplane are positioned 503 for bonding. The μLED array and the backplane are positioned such that each electrode of the μLED array is aligned to a corresponding electrode of the backplane. A bonding process is applied 505 to the μLED array and the backplane. The bonding process may be a thermocompression process in one embodiment. As described above, the alignment material expands to ensure that the electrodes of the μLED array remain aligned with electrodes of the backplane during the bonding process.

Upon reading this disclosure, those of skill in the art will appreciate still additional alternative embodiments through the disclosed principles herein. Thus, while particular embodiments and applications have been illustrated and described, it is to be understood that the disclosed embodiments are not limited to the precise construction and components disclosed herein.

What is claimed is:

1. A method of bonding electrodes of a light emitting diode (LED) array and electrodes on a backplane, the method comprising:
    depositing an alignment material between a pair of LEDs of the LED array after the electrodes of the LED array are formed;
    aligning the electrodes of the LED array and the electrodes of the backplane at a first temperature; and
    applying a bonding process to the LED array and the backplane to bond together the electrodes of the LED array to electrodes of the backplane at a second temperature higher than the first temperature, wherein a surface of the alignment material that faces the backplane is exposed to the backplane after the bonding process and a presence of the alignment material between the pair of LEDs reduces a difference between a thermal expansion of the LED array and a thermal expansion of the backplane responsive to increasing from the first temperature to the second temperature.

2. The method of claim 1, wherein applying the bonding process comprises applying a thermocompression bonding process to the electrodes of the LED array and the electrodes of the backplane.

3. The method of claim 1, wherein the LED array and the backplane are made of different materials having different coefficients of thermal expansion.

4. The method of claim 1, wherein the alignment material comprises at least one of amorphous silicon, hafnia, tantalum dioxidefluoride, tantalum, or tungsten.

5. The method of claim 1, wherein applying the bonding process comprises:
    increasing a temperature from the first temperature to the second temperature, wherein the electrodes of the LED array and the electrodes of the backplane are not in contact as the temperature is increased;
    contacting together the electrodes of the LED array and the electrodes of the backplane after the temperature is increased from the first temperature to the second temperature; and
    bonding together the electrodes of the LED array and the electrodes of the backplane at the second temperature using a thermocompression bonding process.

* * * * *

UNITED STATES PATENT AND TRADEMARK OFFICE
CERTIFICATE OF CORRECTION

PATENT NO. : 10,811,401 B1
APPLICATION NO. : 15/836621
DATED : October 20, 2020
INVENTOR(S) : William Padraic Henry

Page 1 of 1

It is certified that error appears in the above-identified patent and that said Letters Patent is hereby corrected as shown below:

On the Title Page

Item (57), Column 2, under "ABSTRACT", Lines 5-6, delete "blackplane" and insert -- backplane --, therefor.

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*